(12) United States Patent
Chen et al.

(10) Patent No.: US 11,749,740 B2
(45) Date of Patent: Sep. 5, 2023

(54) HIGH ELECTRON MOBILITY TRANSISTOR AND METHOD FOR FABRICATING THE SAME

(71) Applicant: UNITED MICROELECTRONICS CORP., Hsin-Chu (TW)

(72) Inventors: Bo-Rong Chen, Hsinchu County (TW); Che-Hung Huang, Hsinchu (TW); Chun-Ming Chang, Kaohsiung (TW); Yi-Shan Hsu, Taipei (TW); Chih-Tung Yeh, Taoyuan (TW); Shin-Chuan Huang, Tainan (TW); Wen-Jung Liao, Hsinchu (TW); Chun-Liang Hou, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/731,058

(22) Filed: Dec. 31, 2019

(65) Prior Publication Data
US 2021/0175343 A1 Jun. 10, 2021

(30) Foreign Application Priority Data
Dec. 6, 2019 (CN) .......................... 201911241221.7

(51) Int. Cl.
*H01L 29/66* (2006.01)
*H01L 29/778* (2006.01)
*H01L 29/20* (2006.01)

(52) U.S. Cl.
CPC .... *H01L 29/66462* (2013.01); *H01L 29/2003* (2013.01); *H01L 29/7783* (2013.01)

(58) Field of Classification Search
CPC .......... H01L 29/2003; H01L 29/66462; H01L 29/7783
See application file for complete search history.

(56) References Cited

U.S. PATENT DOCUMENTS

| | | | | |
|---|---|---|---|---|
| 5,161,235 A | * | 11/1992 | Shur | H01L 29/1029 257/E29.05 |
| 7,038,252 B2 | * | 5/2006 | Saito | H01L 29/1066 257/103 |
| 7,304,331 B2 | * | 12/2007 | Saito | H01L 29/1066 257/187 |
| 7,576,373 B1 | * | 8/2009 | Hikita | H01L 29/66462 257/192 |
| 7,683,399 B2 | * | 3/2010 | Ishida | H01L 29/0891 257/192 |

(Continued)

OTHER PUBLICATIONS

Lukens et al., "Self-Aligned Process for Selectively Etched p-GaN-Gated AlGaN/GaN-on-Si HFETs," IEEE Transactions On Electron Devices 65 (2018) pp. 3732-3738.*

(Continued)

*Primary Examiner* — Jay C Kim
(74) *Attorney, Agent, or Firm* — Winston Hsu

(57) ABSTRACT

A method for fabricating high electron mobility transistor (HEMT) includes the steps of: forming a first barrier layer on a substrate; forming a p-type semiconductor layer on the first barrier layer; forming a hard mask on the p-type semiconductor layer; patterning the hard mask and the p-type semiconductor layer; and forming a spacer adjacent to the hard mask and the p-type semiconductor layer.

2 Claims, 4 Drawing Sheets

(56) References Cited

U.S. PATENT DOCUMENTS

| | | | | |
|---|---|---|---|---|
| 7,728,356 | B2* | 6/2010 | Suh | H01L 29/66462 257/194 |
| 7,795,642 | B2* | 9/2010 | Suh | H01L 29/7787 257/268 |
| 7,816,707 | B2* | 10/2010 | Hikita | H01L 29/7783 257/192 |
| 7,825,434 | B2* | 11/2010 | Ueno | H01L 29/7783 257/194 |
| 7,838,904 | B2* | 11/2010 | Nakazawa | H01L 29/1029 257/194 |
| 7,851,825 | B2* | 12/2010 | Suh | H01L 29/42316 257/194 |
| 7,863,649 | B2* | 1/2011 | Hikita | H01L 29/808 257/194 |
| 7,915,643 | B2* | 3/2011 | Suh | H01L 29/2003 257/194 |
| 8,076,685 | B2* | 12/2011 | Tamura | H01L 29/7787 257/97 |
| 8,076,698 | B2* | 12/2011 | Ueda | H01L 29/1066 257/194 |
| 8,129,748 | B2* | 3/2012 | Uemoto | H01L 29/1066 257/192 |
| 8,404,508 | B2* | 3/2013 | Lidow | H01L 29/7786 438/46 |
| 8,436,398 | B2* | 5/2013 | Lidow | H01L 29/7786 257/189 |
| 8,441,035 | B2* | 5/2013 | Hikita | H01L 29/7786 257/192 |
| 8,581,300 | B2* | 11/2013 | Yamada | H01L 29/42316 257/194 |
| 8,823,012 | B2* | 9/2014 | Lidow | H01L 29/1066 257/76 |
| 8,890,168 | B2* | 11/2014 | Lidow | H01L 29/1066 257/76 |
| 8,890,206 | B2* | 11/2014 | Yamada | H01L 29/778 257/190 |
| 8,907,349 | B2* | 12/2014 | Ando | H01L 29/66462 257/194 |
| 8,946,771 | B2* | 2/2015 | Hsiung | H01L 29/7787 257/189 |
| 9,035,356 | B2* | 5/2015 | Yamada | H01L 29/205 257/194 |
| 9,099,351 | B2* | 8/2015 | Nishimori | H01L 29/66462 |
| 9,190,506 | B2* | 11/2015 | Tanimoto | H01L 29/66462 |
| 9,214,538 | B2* | 12/2015 | Marino | H01L 29/7787 |
| 9,269,800 | B2* | 2/2016 | Cheng | H01L 29/2003 |
| 9,299,822 | B2* | 3/2016 | Kikkawa | H01L 29/66462 |
| 9,343,560 | B2* | 5/2016 | Suh | H01L 29/402 |
| 9,425,301 | B2* | 8/2016 | Chiu | H01L 29/7848 |
| 9,543,391 | B2* | 1/2017 | Hwang | H01L 29/7789 |
| 9,543,424 | B2* | 1/2017 | Derluyn | H01L 29/7786 |
| 9,601,608 | B2* | 3/2017 | Tsai | H01L 29/66462 |
| 9,685,549 | B2* | 6/2017 | Okita | H01L 29/7789 |
| 9,741,840 | B1* | 8/2017 | Moens | H01L 21/8252 |
| 9,768,257 | B2* | 9/2017 | Ota | H01L 29/1029 |
| 9,842,905 | B2* | 12/2017 | Kinoshita | H01L 29/808 |
| 9,847,401 | B2* | 12/2017 | Chiu | H01L 21/02458 |
| 9,917,195 | B2* | 3/2018 | Cai | H01L 29/7851 |
| 10,038,085 | B2* | 7/2018 | Curatola | H01L 29/2003 |
| 10,096,702 | B2* | 10/2018 | Beach | H01L 29/2003 |
| 10,529,808 | B2* | 1/2020 | Mohapatra | H01L 29/1054 |
| 10,529,841 | B2* | 1/2020 | Kajitani | H01L 29/66462 |
| 10,553,712 | B2* | 2/2020 | Shrivastava | H01L 29/778 |
| 10,622,455 | B2* | 4/2020 | Cao | H01L 29/432 |
| 10,672,763 | B2* | 6/2020 | Jiang | H01L 27/0605 |
| 10,784,336 | B2* | 9/2020 | Liu | H01L 29/205 |
| 10,804,384 | B2* | 10/2020 | Nagase | H01L 29/42364 |
| 10,903,333 | B2* | 1/2021 | Cao | H01L 29/7813 |
| 11,322,600 | B2* | 5/2022 | Liu | H01L 29/7786 |
| 11,362,205 | B2* | 6/2022 | Sun | H01L 29/2003 |
| 2007/0205433 | A1 | 9/2007 | Parikh et al. | |
| 2017/0148906 | A1* | 5/2017 | Lucolano | H01L 29/1045 |
| 2018/0248027 | A1* | 8/2018 | Okita | H01L 29/1029 |
| 2020/0303533 | A1* | 9/2020 | Guo | H01L 29/402 |

OTHER PUBLICATIONS

Panda et al., "Modeling and simulation of enhancement mode p-GaN Gate AlGaN/GaN HEMT for RF circuit switch applications," Journal of Semiconductors 38 (2017) 064002.*

Badawi et al., "Investigation of the Dynamic On-State Resistance of 600V Normally-off and Normally-on GaN HEMTs," 7th IEEE Energy Conversion Congress and Exposition ECCE (2015) Canada.*

Zeng et al., "A Comprehensive Review of Recent Progress on GaN High Electron Mobility Transistors: Devices, Fabrication and Reliability," Electronics 7 (2018) 377.*

Greco et al., "Review of technology for normally-off HEMTs with p-GaN gate," Materials Science in Semiconductor Processing 78 (2018) pp. 96-106.*

Okita ,Title: Through Recessed and Regrowth Gate Technology for Realizing Process Stability of GaN-GITs Proceedings of the 2016 28th International Symposium on Power Semiconductor Devices and ICs ,Jun. 12, 2016.

* cited by examiner

HIGH ELECTRON MOBILITY TRANSISTOR AND METHOD FOR FABRICATING THE SAME

BACKGROUND OF THE INVENTION

1. Field of the Invention

The invention relates to a high electron mobility transistor (HEMT) and method for fabricating the same.

2. Description of the Prior Art

High electron mobility transistor (HEMT) fabricated from GaN-based materials have various advantages in electrical, mechanical, and chemical aspects of the field. For instance, advantages including wide band gap, high break down voltage, high electron mobility, high elastic modulus, high piezoelectric and piezoresistive coefficients, and chemical inertness. All of these advantages allow GaN-based materials to be used in numerous applications including high intensity light emitting diodes (LEDs), power switching devices, regulators, battery protectors, display panel drivers, and communication devices.

SUMMARY OF THE INVENTION

According to an embodiment of the present invention, a method for fabricating high electron mobility transistor (HEMT) includes the steps of: forming a first barrier layer on a substrate; forming a p-type semiconductor layer on the first barrier layer; forming a hard mask on the p-type semiconductor layer; patterning the hard mask and the p-type semiconductor layer; and forming a spacer adjacent to the hard mask and the p-type semiconductor layer.

According to another aspect of the present invention, a method for fabricating high electron mobility transistor (HEMT) includes the steps of: forming a first barrier layer on a substrate; forming a p-type semiconductor layer on the first barrier layer; patterning the p-type semiconductor layer; and forming a spacer adjacent to the p-type semiconductor layer.

According to yet another aspect of the present invention, a high electron mobility transistor (HEMT) includes: a buffer layer on a substrate; a first barrier layer on the buffer layer; a p-type semiconductor layer on the first barrier layer; and a spacer adjacent to the p-type semiconductor layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
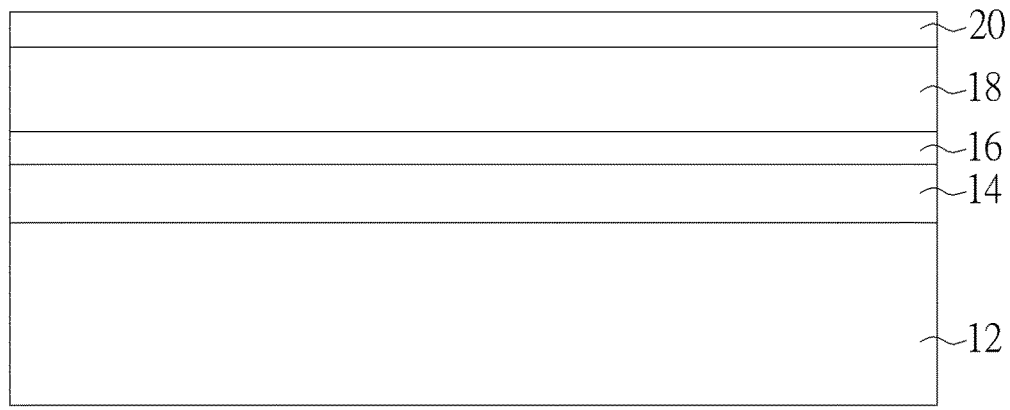
FIGS. 1-5 illustrate a method for fabricating a HEMT according to an embodiment of the present invention.

Referring to the FIGS. 1-5, FIGS. 1-5 illustrate a method for fabricating a HEMT according to an embodiment of the present invention. As shown in the FIG. 1, a substrate 12 such as a substrate made from silicon, silicon carbide, or aluminum oxide (or also referred to as sapphire) is provided, in which the substrate 12 could be a single-layered substrate, a multi-layered substrate, gradient substrate, or combination thereof. According to other embodiment of the present invention, the substrate 12 could also include a silicon-on-insulator (SOI) substrate.

Next, a buffer layer 14 is formed on the substrate 12. According to an embodiment of the present invention, the buffer layer 14 is preferably made of III-V semiconductors such as gallium nitride (GaN), in which a thickness of the buffer layer 14 could be between 0.5 microns to 10 microns. According to an embodiment of the present invention, the formation of the buffer layer 14 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a first barrier layer 16 is formed on the surface of the buffer layer 14. In this embodiment, the first barrier layer 16 is preferably made of III-V semiconductor such as aluminum gallium nitride ($Al_xGa_{1-x}N$), in which 0<x<1, x being less than or equal to 20%, and the first barrier layer 16 preferably includes an epitaxial layer formed through epitaxial growth process. Similar to the buffer layer 14, the formation of the first barrier layer 16 on the buffer layer 14 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a p-type semiconductor layer 18 and a hard mask 20 are sequentially formed on the surface of the first barrier layer 16. In this embodiment, the p-type semiconductor layer 18 is preferably a III-V compound layer including p-type GaN (p-GaN) and the formation of the p-type semiconductor layer 18 on the first barrier layer 16 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof. The hard mask 20 could include dielectric, conductive, or metal material including but not limited to for example silicon nitride, silicon oxide, or titanium nitride.

Figure 2:
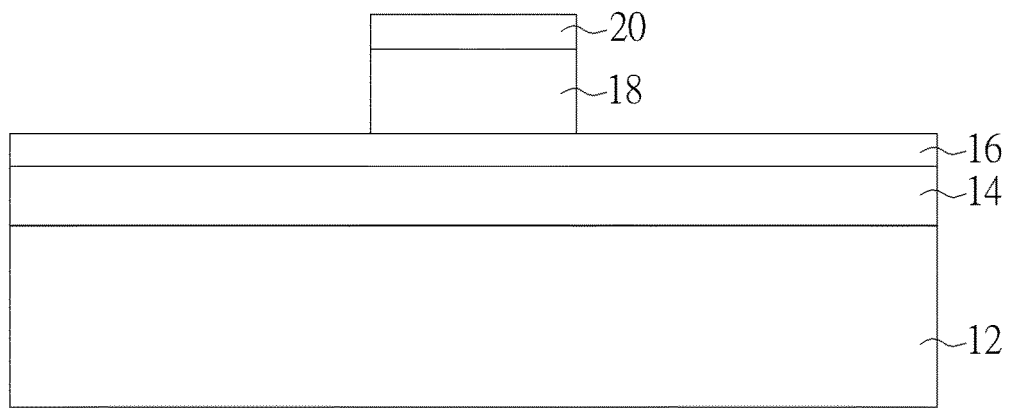

Next, as shown in FIG. 2, a pattern transfer process is conducted to pattern the hard mask 20 and the p-type semiconductor layer 18 by first using a patterned mask (not shown) as mask to remove part of the hard mask 20 and part of the p-type semiconductor layer 18 for exposing the surface of the first barrier layer 16 adjacent to two sides of the patterned p-type semiconductor layer 18, in which the patterned p-type semiconductor layer 18 preferably becomes a part of the gate structure of the HEMT in the later process. It should be noted that to prevent a continuous p-type semiconductor layer 18 from inducing a micro loading effect, the pattern transfer process conducted at this stage preferably removes all of the remaining p-type semiconductor layer 18 adjacent to two sides of the patterned p-type semiconductor layer 18 during the patterning process to expose the surface of the first barrier layer 16 so that the top surface of the first barrier layer 16 adjacent to two sides of the patterned p-type semiconductor layer 18 could be even with or slightly lower than the top surface of the first barrier layer 16 directly under the p-type semiconductor layer 18.

Figure 3:
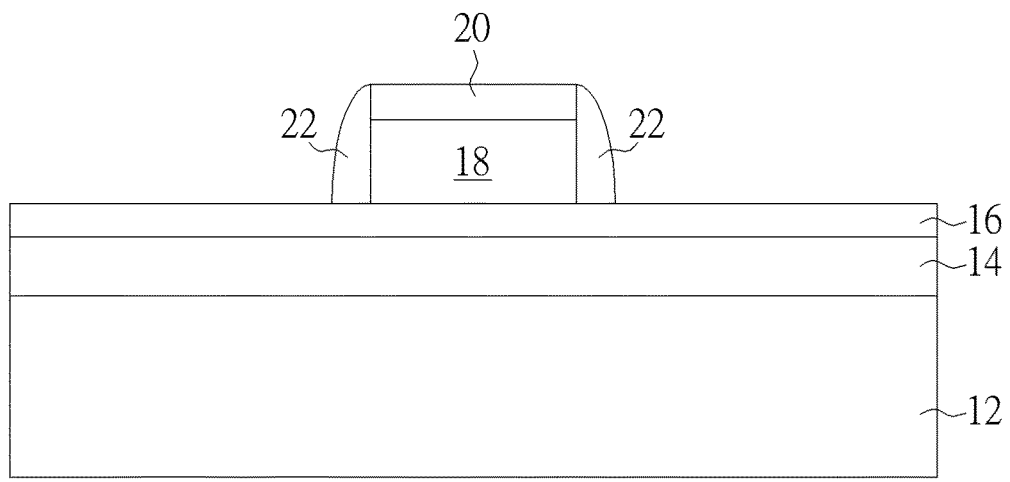

Next, as shown in FIG. 3, a spacer 22 is formed adjacent to the hard mask 20 and the p-type semiconductor layer 18. Specifically, the formation of the spacer 22 could be accomplished by first forming a liner (not shown) made of dielectric material on the substrate 12 to cover the first barrier layer 16 and the hard mask 20, and an etching back process is conducted to remove part of the liner for forming a spacer 22 on sidewalls of the p-type semiconductor layer 18 and the hard mask 20, in which the top surface of the spacer 22 is preferably even with the top surface of the hard mask 20. It should be noted that even though the spacer 22 pertains to be a single spacer in this embodiment, it would also be desirable to adjust the number of the liner being deposited to form one or more spacers including two, three, or even four spacers on sidewalls of the p-type semiconductor layer 18 and the hard mask 20. Preferably, each of the spacers 22 could include an I-shape and/or L-shape cross-section and each of the spacers could include silicon oxide, silicon nitride, silicon oxynitride (SiON), silicon carbon nitride (SiCN), or combination thereof.

Figure 4:
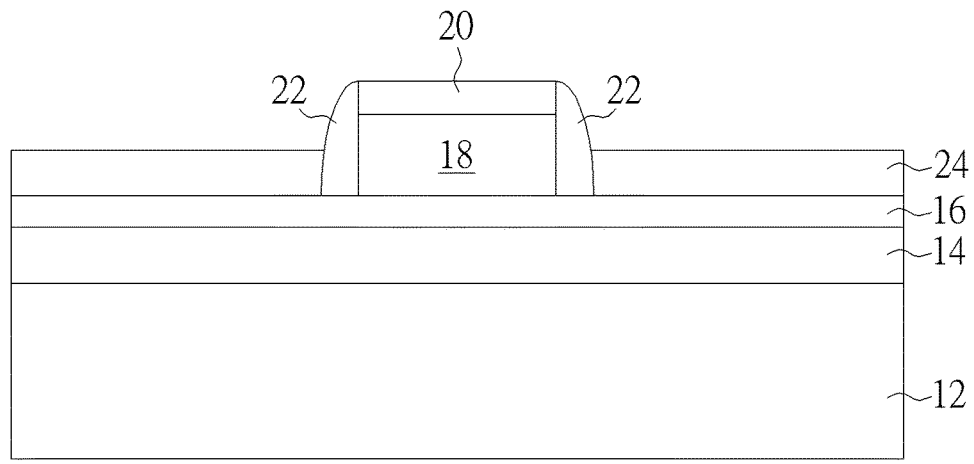

Next, as shown in FIG. 4, a second barrier layer 24 is formed on the surface of the first barrier layer 16 adjacent to two sides of the spacer 22. Preferably, the first barrier layer 16 and the second barrier layer 24 are made of III-V semiconductor such as aluminum gallium nitride ($Al_xGa_{1-x}N$) and each of the two layers includes an epitaxial layer formed through epitaxial growth process. In this embodiment, the first barrier layer 16 and the second barrier layer 24 preferably include different thicknesses such as the thickness of the first barrier layer 16 is preferably less than the thickness of the second barrier layer 24.

Moreover, the first barrier layer 16 and the second barrier layer 24 preferably include different concentrations of aluminum or more specifically the aluminum concentration of the first barrier layer 16 is less than the aluminum concentration of the second barrier layer 24. For instance, the first barrier layer 16 is made of III-V semiconductor such as aluminum gallium nitride ($Al_xGa_{1-x}N$), in which $0<x<1$, x being 5-15% and the second barrier layer 24 is made of III-V semiconductor such as aluminum gallium nitride ($Al_xGa_{1-x}N$), in which $0<x<1$, x being 15-50%. Similar to the formation of the first barrier layer 16, the formation of the second barrier layer 24 on the first buffer layer 16 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Figure 5:
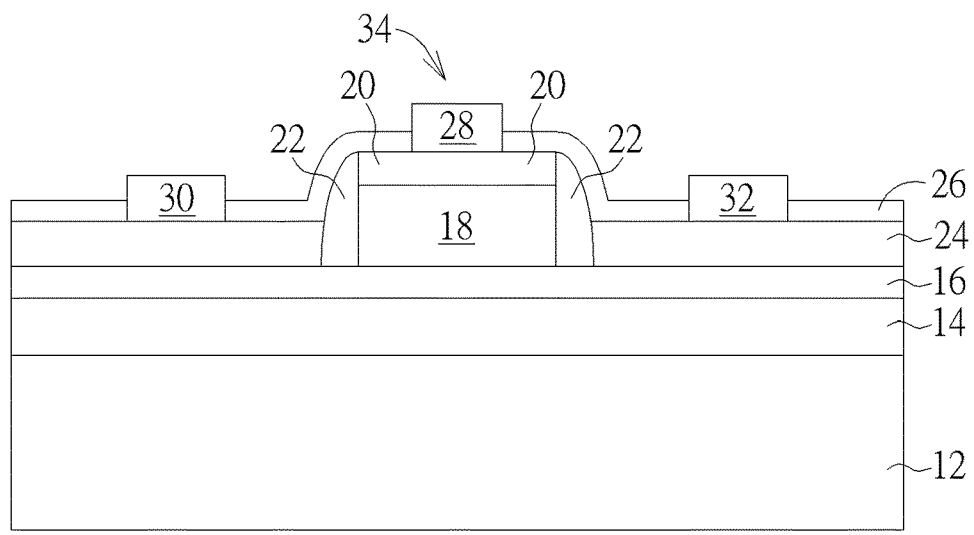

Next, as shown in FIG. 5, a passivation layer 26 is formed on the surfaces of the second barrier layer 24, the spacer 22, and the hard mask 20, and a gate electrode 28 is formed on the hard mask 20 and a source electrode 30 and a drain electrode 32 are formed adjacent to two sides of the gate electrode 28, in which the p-type semiconductor layer 18, the hard mask 20, and the gate electrode 28 could constitute a gate structure 34 altogether. In this embodiment, it would be desirable to conduct a photo-etching process to remove part of the passivation layer 26 directly on top of the p-type semiconductor layer 18 or hard mask 20 to form a recess (not shown), form a gate electrode 28 in the recess, remove part of the passivation layer 26 adjacent to two sides of the spacer 22 to form two recesses, and then form source electrode 30 and drain electrode 32 in the two recesses adjacent to two sides of the gate electrode 28.

It should be noted that the hard mask 20 in this embodiment is preferably made of conductive material such as titanium nitride (TiN) so that the gate electrode 28 could be disposed directly on the surface of the hard mask 20 without contacting the p-type semiconductor layer 18 directly. Moreover, the gate electrode 28, the source electrode 30, and the drain electrode 32 are preferably made of metal, in which the gate electrode 28 is preferably made of Schottky metal while the source electrode 30 and the drain electrode 32 are preferably made of ohmic contact metals. According to an embodiment of the present invention, each of the gate electrode 28, source electrode 30, and drain electrode 32 could include gold (Au), Silver (Ag), platinum (Pt), titanium (Ti), aluminum (Al), tungsten (W), palladium (Pd), or combination thereof. Preferably, it would be desirable to conduct an electroplating process, sputtering process, resistance heating evaporation process, electron beam evaporation process, physical vapor deposition (PVD) process, chemical vapor deposition (CVD) process, or combination thereof to form electrode materials in the aforementioned recesses, and then pattern the electrode materials through one or more etching processes to form the gate electrode 28, source electrode 30, and the drain electrode 32. This completes the fabrication of a HEMT according to an embodiment of the present invention.

Figure 6:
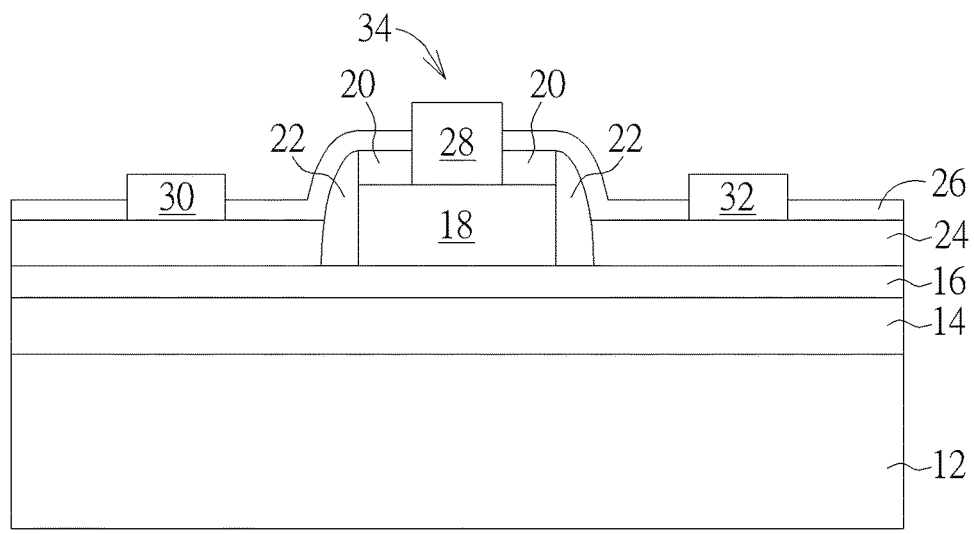
FIG. 6 illustrates a structural view of a HEMT according to an embodiment of the present invention.
Figure 7:
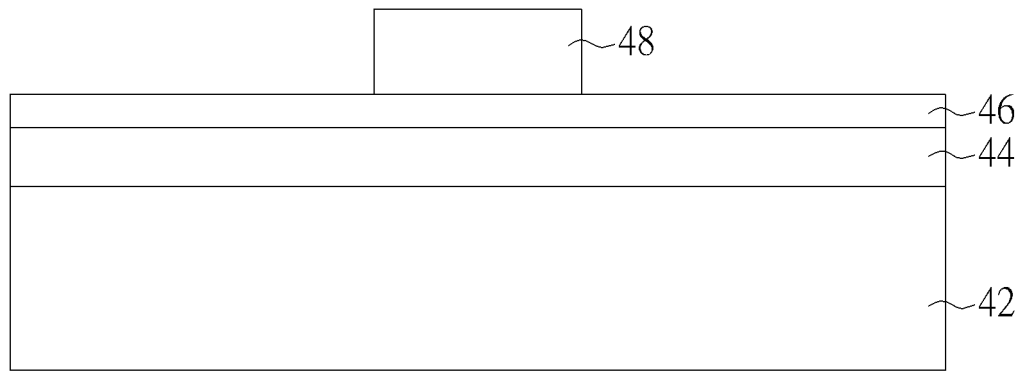
FIGS. 7-12 illustrate a method for fabricating a HEMT according to an embodiment of the present invention.

Referring to FIG. 6, FIG. 6 illustrates a structural view of a HEMT according to an embodiment of the present invention. As shown in FIG. 6, the HEMT similar to the embodiment disclosed in FIG. 5 also includes a buffer layer 14 disposed on the substrate 12, a first barrier layer 16 disposed on the buffer layer 14, a p-type semiconductor layer 18 disposed on the first barrier layer 16, a gate electrode 28 disposed on the p-type semiconductor layer 18, a hard mask 20 disposed on the p-type semiconductor layer 18, a spacer 22 disposed adjacent to the p-type semiconductor layer 18 and the hard mask 20, a second barrier layer 24 disposed on the first barrier layer 16 adjacent to the spacer 22, and a source electrode 30 and drain electrode 32 disposed on the second barrier layer 24 adjacent to two sides of the spacer 22.

In contrast to the hard mask 20 in FIG. 5 made of conductive material, the hard mask 20 in this embodiment could be made of conductive or dielectric material including but not limited to for example TiN, silicon oxide, or silicon nitride. In this approach, it would be desirable to have the gate electrode 28 penetrating the hard mask 20 and contacting the surface of the p-type semiconductor layer 18 directly, or if viewed from another perspective the hard mask 20 is disposed on the p-type semiconductor layer 18 and surrounding the gate electrode 28.

Referring to FIGS. 7-12, FIGS. 7-12 illustrate a method for fabricating a HEMT according to an embodiment of the present invention. As shown in the FIG. 7, a substrate 42 such as a substrate made from silicon, silicon carbide, or aluminum oxide (or also referred to as sapphire) is provided, in which the substrate 42 could be a single-layered substrate, a multi-layered substrate, gradient substrate, or combination thereof. According to other embodiment of the present invention, the substrate 42 could also include a silicon-on-insulator (SOI) substrate.

Next, a buffer layer 44 is formed on the substrate 12. According to an embodiment of the present invention, the buffer layer 44 is preferably made of III-V semiconductors such as gallium nitride (GaN), in which a thickness of the buffer layer 44 could be between 0.5 microns to 10 microns. According to an embodiment of the present invention, the formation of the buffer layer 44 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a first barrier layer 46 is formed on the surface of the buffer layer 44. In this embodiment, the first barrier layer 46 is preferably made of III-V semiconductor such as aluminum gallium nitride ($Al_xGa_{1-x}N$), in which $0<x<1$, x being less than or equal to 20%, and the first barrier layer 46 preferably includes an epitaxial layer formed through epitaxial growth process. Similar to the buffer layer 44, the formation of the first barrier layer 46 on the buffer layer 44 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next, a p-type semiconductor layer 48 is formed on the surface of the first barrier layer 46. In this embodiment, the p-type semiconductor layer 48 is preferably a III-V compound layer including p-type GaN (p-GaN) and the formation of the p-type semiconductor layer 48 on the first barrier layer 46 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Next similar to FIG. 2, a pattern transfer process is conducted to pattern the p-type semiconductor layer 48 by first using a patterned mask (not shown) as mask to remove part of part of the p-type semiconductor layer 48 for exposing the surface of the first barrier layer 46 adjacent to two sides of the patterned p-type semiconductor layer 48, in which the patterned p-type semiconductor layer 48 preferably becomes a part of the gate structure of the HEMT in the later process. Similar to the aforementioned embodiment of preventing a continuous p-type semiconductor layer 48 from inducing a micro loading effect, the pattern transfer process conducted at this stage preferably removes all of the remaining p-type semiconductor layer 48 adjacent to two sides of the patterned p-type semiconductor layer 48 during the patterning process to expose the surface of the first barrier layer 46 so that the top surface of the first barrier layer 46 adjacent to two sides of the patterned p-type semiconductor layer 48 could be even with or slightly lower than the top surface of the first barrier layer 46 directly under the p-type semiconductor layer 48.

Figure 8:
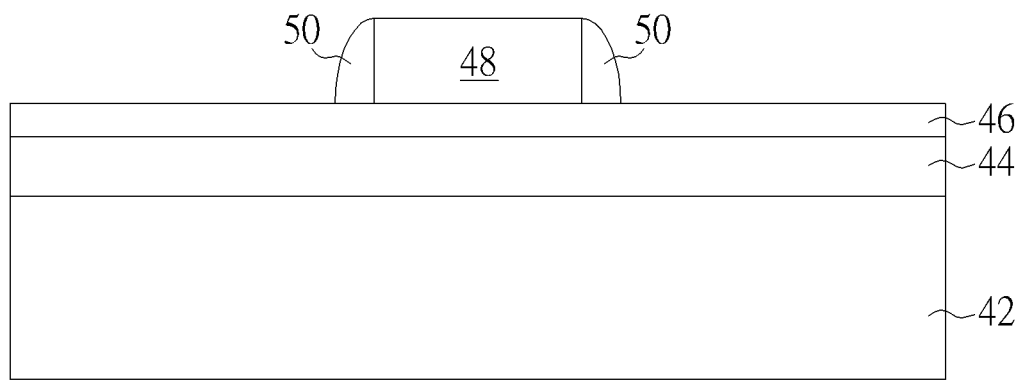

Next, as shown in FIG. 8, a spacer 50 is formed adjacent to the p-type semiconductor layer 48. Specifically, the formation of the spacer 50 could be accomplished by first forming a liner (not shown) made of dielectric material on the substrate 42 to cover the first barrier layer 46 and p-type semiconductor layer 48, and an etching back process is conducted to remove part of the liner for forming a spacer 50 on sidewalls of the p-type semiconductor layer 48. Since no hard mask is formed on top of the p-type semiconductor layer 48, the top surface of the spacer 50 is preferably even with the top surface of the p-type semiconductor layer 48. It should be noted that even though the spacer 50 pertains to be a single spacer in this embodiment, it would also be desirable to adjust the number of the liner being deposited to form one or more spacers including two, three, or even four spacers on sidewalls of the p-type semiconductor layer 48, which each of the spacers 50 could include an I-shape and/or L-shape cross-section and each of the spacers could include silicon oxide, silicon nitride, silicon oxynitride (SiON), silicon carbon nitride (SiCN), or combination thereof, which are all within the scope of the present invention.

Figure 9:
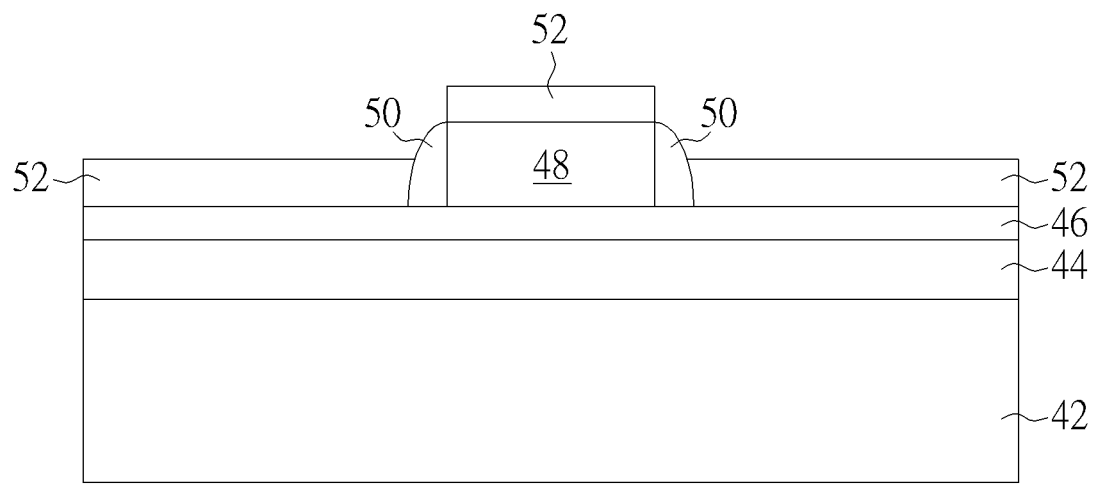

Next, as shown in FIG. 9, a second barrier layer 52 is formed on the surface of the first barrier layer 46 adjacent to two sides of the spacer 50 and the top surface of the p-type semiconductor layer 48. Preferably, the first barrier layer 46 and the second barrier layer 52 are made of III-V semiconductor such as aluminum gallium nitride ($Al_xGa_{1-x}N$) and each of the two layers includes an epitaxial layer formed through epitaxial growth process. In this embodiment, the first barrier layer 46 and the second barrier layer 52 preferably include different thicknesses such as the thickness of the first barrier layer 46 is preferably less than the thickness of the second barrier layer 52.

Moreover, the first barrier layer 46 and the second barrier layer 52 preferably include different concentrations of aluminum or more specifically the aluminum concentration of the first barrier layer 46 is less than the aluminum concentration of the second barrier layer 52. For instance, the first barrier layer 46 is made of III-V semiconductor such as aluminum gallium nitride ($Al_xGa_{1-x}N$), in which $0<x<1$, x being 5-15% and the second barrier layer 52 is made of III-V semiconductor such as aluminum gallium nitride ($Al_xGa_{1-x}N$), in which $0<x<1$, x being 15-50%. Similar to the formation of the first barrier layer 46, the formation of the second barrier layer 52 on the first buffer layer 46 could be accomplished by a molecular-beam epitaxy (MBE) process, a metal organic chemical vapor deposition (MOCVD) process, a chemical vapor deposition (CVD) process, a hydride vapor phase epitaxy (HVPE) process, or combination thereof.

Figure 10:
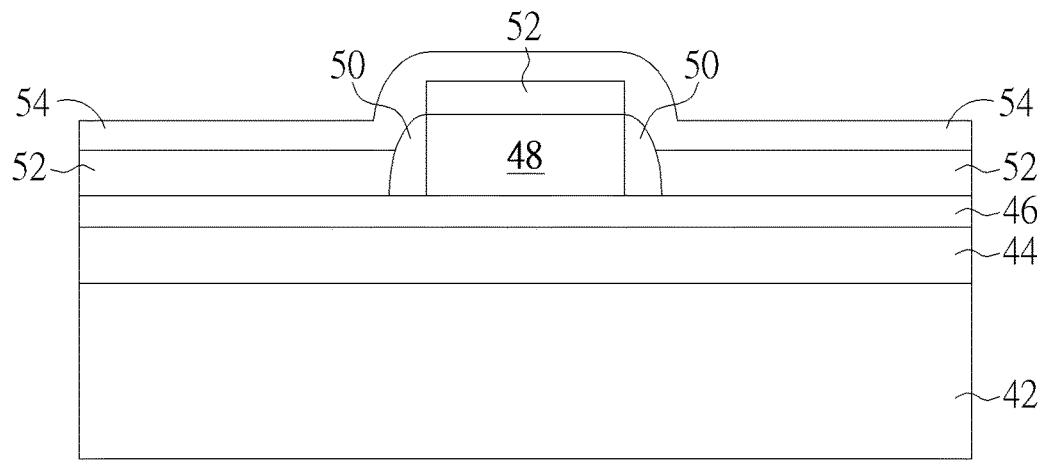

Next, as shown in FIG. 10, a hard mask 54 is formed to cover the second barrier layer 52 and the exposed spacer 50 entirely. In this embodiment, the hard mask 54 could include be made of conductive or dielectric material including but not limited to for example silicon oxide, silicon nitride, TiN, or aluminum oxide (AlO).

Figure 11:
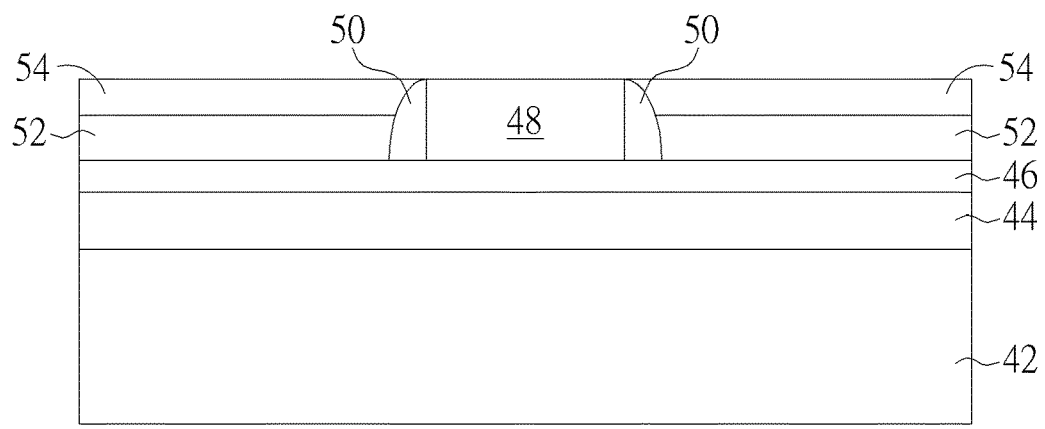

Next, as shown in FIG. 11, a planarizing process such as chemical mechanical polishing (CMP) process is conducted to remove part of the hard mask 54 and the entire second barrier layer 52 disposed directly on top of the p-type semiconductor layer 48 so that the top surface of the remaining hard mask 54 adjacent to two sides of the spacer 50 is even with the top surface of the p-type semiconductor layer 48.

Figure 12:
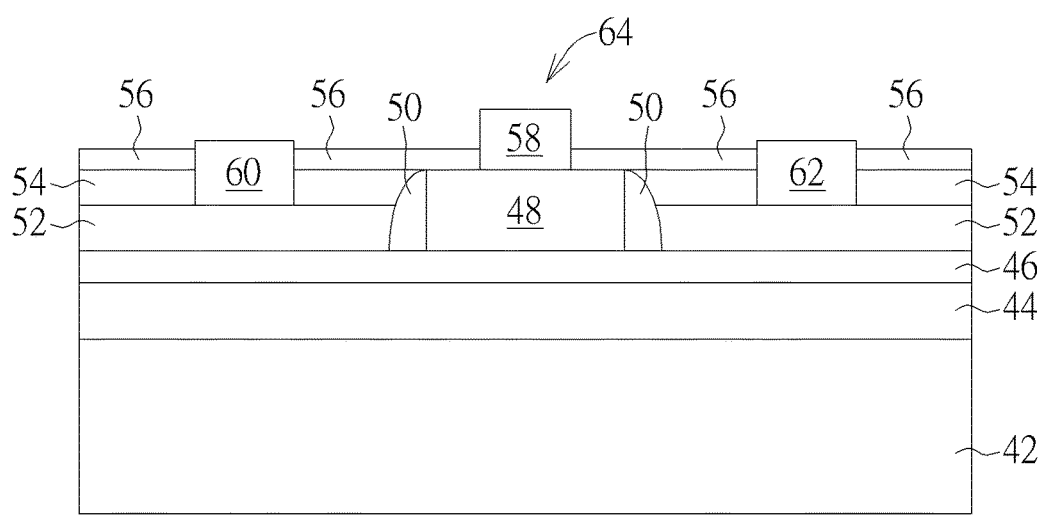

Next, as shown in FIG. 12, a passivation layer 56 is formed on the surface of the hard mask 54, and a gate electrode 58 is formed in the passivation layer 56 on top of the p-type semiconductor layer 48 and a source electrode 60 and a drain electrode 62 are formed adjacent to two sides of the gate electrode 58, in which the p-type semiconductor layer 48 and the gate electrode 58 could constitute a gate structure 64 altogether. In this embodiment, it would be desirable to conduct a photo-etching process to remove part of the passivation layer 56 directly on top of the p-type semiconductor layer 48 to form a recess (not shown), form a gate electrode 58 in the recess, remove part of the passivation layer 56 and part of the hard mask 54 adjacent to two sides of the spacer 50 to form two recesses, and then form the source electrode 60 and drain electrode 62 in the two recesses adjacent to two sides of the gate electrode 58.

In this embodiment, the gate electrode 58, the source electrode 60, and the drain electrode 62 are preferably made of metal, in which the gate electrode 58 is preferably made of Schottky metal while the source electrode 60 and the drain electrode 62 are preferably made of ohmic contact metals. According to an embodiment of the present invention, each of the gate electrode 58, source electrode 60, and drain electrode 62 could include gold (Au), Silver (Ag), platinum (Pt), titanium (Ti), aluminum (Al), tungsten (W), palladium (Pd), or combination thereof. Preferably, it would be desirable to conduct an electroplating process, sputtering process, resistance heating evaporation process, electron beam evaporation process, physical vapor deposition (PVD)

process, chemical vapor deposition (CVD) process, or combination thereof to form electrode materials in the aforementioned recesses, and then pattern the electrode materials through one or more etching processes to form the gate electrode 58, source electrode 60, and the drain electrode 62. This completes the fabrication of a HEMT according to an embodiment of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A high electron mobility transistor (HEMT), comprising:
   a buffer layer on a substrate;
   a first barrier layer on the buffer layer;
   a p-type semiconductor layer on the first barrier layer;
   a spacer adjacent to the p-type semiconductor layer, wherein the spacer is made of a dielectric material, a bottom surface of the spacer is even with a bottom surface of the p-type semiconductor layer, the spacer comprises an inner sidewall and an outer sidewall, and the outer sidewall of the spacer comprises a curve;
   a second barrier layer adjacent to the spacer on the first barrier layer, wherein a topmost surface of the second barrier layer is lower than a top surface of the p-type semiconductor layer;
   a gate electrode on and directly contacting the p-type semiconductor layer, wherein a width of the gate electrode is less than a width of the p-type semiconductor layer;
   a hard mask on the p-type semiconductor layer and laterally around the gate electrode, wherein a bottom surface of the hard mask is even with a bottom surface of the gate electrode, a top surface of the hard mask is lower than a top surface of the gate electrode, and a topmost point of the spacer is at the same level with the top surface of the hard mask and lower than the top surface of the gate electrode; and
   a source electrode and a drain electrode adjacent to two sides of the spacer.

2. The HEMT of claim 1, wherein the hard mask comprises a dielectric material.

\* \* \* \* \*